(12) United States Patent
Shiu et al.

(10) Patent No.: US 6,777,334 B2
(45) Date of Patent: Aug. 17, 2004

(54) METHOD FOR PROTECTING A WAFER BACKSIDE FROM ETCHING DAMAGE

(75) Inventors: Le Der Shiu, Tainan (TW); Pin Chia Su, Kaohsiung (TW); Yin Shen Chu, Taichung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 97 days.

(21) Appl. No.: 10/190,073

(22) Filed: Jul. 3, 2002

(65) Prior Publication Data

US 2004/0018732 A1 Jan. 29, 2004

(51) Int. Cl.[7] .................................. H01L 21/461
(52) U.S. Cl. .................. 438/689; 438/745; 438/720
(58) Field of Search .......................... 438/720, 689, 438/745, 749, 754, 725

(56) References Cited

U.S. PATENT DOCUMENTS

2003/0096507 A1 * 5/2003 Baker et al. ................. 438/778
2003/0219912 A1 * 11/2003 Chen et al. ..................... 438/3

* cited by examiner

Primary Examiner—Tuan H. Nguyen
(74) Attorney, Agent, or Firm—Tung & Associates

(57) ABSTRACT

A method for protecting a silicon semiconductor wafer backside surface for removing polymer containing residues from a wafer process surface including providing a silicon semiconductor wafer having a process surface and a backside surface said process surface including metal containing features said process surface at least partially covered with polymer containing residues and said backside surface including exposed silicon containing areas; forming an etching resistant oxide layer over the exposed silicon containing areas; and, subjecting the silicon semiconductor wafer to a series of cleaning steps including a wet etchant corrosive to the exposed silicon containing areas.

15 Claims, 1 Drawing Sheet

METHOD FOR PROTECTING A WAFER BACKSIDE FROM ETCHING DAMAGE

FIELD OF THE INVENTION

This invention generally relates to removal of polymer residues following an etching process and more particularly to a method for protecting a wafer backside to prevent etching damage in a wet polymer stripping (PRS) process whereby polymer residues are removed following a metal etching process.

BACKGROUND OF THE INVENTION

In the fabrication of semiconductor devices multiple layers are required for providing a multi-layered interconnect structure. During the manufacture of integrated circuits it is common to place material photoresist on top of a semiconductor wafer in desired patterns and to etch away or otherwise remove surrounding material not covered by the resist pattern in order to produce metal conductor runs or other desired features. During the formation of semiconductor devices it is often required that the conductive layers be interconnected through holes in an insulating layer. Such holes are commonly referred to as contact holes, i.e., when the hole extends through an insulating layer to an active device area, or vias, i.e., when the hole extends through an insulating layer between two conductive layers. The profile of a hole is of particular importance since that it exhibits specific electrical characteristics when the contact hole or via is filled with a conductive material. In addition, metal interconnect lines may be formed by selectively anisotropically etching away areas (gaps) in a layer of metal to leave metal interconnect lines which are subsequently covered with a layer of dielectric insulating material to fill the gaps.

In anisotropic etching processes, such as those using halocarbon containing plasmas, polymer deposition on the sidewalls and bottom surface of the feature being etched occurs simultaneously with the etching of the oxide or the metal, as the case may be. Surfaces struck by the ions at a lower rate tend to remove the nonvolatile polymeric residual layer at a lower rate, thereby at steady state, leaving a layer of nonvolatile polymeric or metal-polymeric residue on surfaces such as the sidewalls of the etched features, thereby protecting such surfaces against etching by the reactive gas. As such, etching is performed preferentially in a direction perpendicular to the wafer surface since the bottom surfaces etch at a higher rate than the polymeric residue containing sidewalls (i.e., anisotropic etching). If metal is being etched, for example, in etching metal lines, metal will simultaneously deposit with the polymer thus forming a metal-polymer residue on the sidewalls of the etched opening.

In a typical process, for example, an overlying photoresist layer is photolithographically patterned to anisotropically etch the semiconductor features in an underlying layer, for example a metal layer for metal interconnect line etching or an insulating dielectric layer for etching damascene features such as vias or contact holes. After the features are etched, the photoresist mask which remains overlying the upper surface of the etched features may be removed by a reactive ion etch (RIE) process also referred to as an ashing process, for example, carried out in a quartz chamber using a plasma of $O_2$ or a combination of $CF_4$ and $O_2$ to etch the photoresist material.

It has been the practice in the art to remove at least a portion of the photoresist in-situ by an ashing process following an RIE etching procedure where metal is exposed, for instance after anisotropically etching the metal conductive layer, since exposure of the metal to atmospheric conditions can cause metallic corrosion. In such an in-situ ashing process, the photoresist removal may take place by a reactive ion etching (RIE) method using an oxygen containing plasma in an ashing chamber module of a multiple chamber metal etcher.

A processing difficulty arises, however, when a metal-polymer residue forms upon etching a semiconductor feature. In a typical RIE etching process, for example, in etching via openings, etching takes place through the intermetal dielectric (IMD) layer to expose an underlying metallic contact. Typically the metallic portion is over etched to assure adequate contact of the via opening (which will later be filled with a metallic material) with the underlying metal contact layer. As a result, during the etching process, a metal-polymer residue is formed on the sidewalls of the etched opening that cannot be removed by the RIE ashing process.

Further, the RIE ashing process to remove the overlying photoresist may tend to oxidize the metal-polymer residue formed on the sidewalls of an etched opening thereby making it even more resistant etching in an RIE ashing process. As a result, the metal-polymer residue formed on the sidewalls of an etched opening cannot be successfully removed by an in-situ ashing process and must be additionally cleaned by an ex-situ wet etching process, for example, a wet polymer strip process (PRS).

For example, in a typical wet polymer strip process (PRS) bench configuration wafers are transferred for processing at one or more wet chemical bench process lines. The wafers are typically sequentially immersed in various solutions for a period of time including a primary solvent (wet etching solution) of, for example, ACT available from Ashland Chemical and composed of DMSO (Dimethyl-sulphur-oxide), MEA (Mono-Ethyl-Amine) and catechol typically provided at an elevated temperature. The process wafers are then typically immersed in a neutralizing intermediate solvent solution, for example, n-methyl pyrrolidone (NMP) followed by rinsing solutions of deionized water.

One problem with the prior art wet chemical polymer stripping process is that the wet etching solution including, for example, ACT etches the exposed silicon on the backside of the process wafer. As a result, the backside of the process wafer experiences preferential etching, for example, believed to be related to the dipping or immersion process in the etchant solution carried out in the wet chemical polymer stripping process. As a result, the backside of the process wafer surface is adversely affected by the preferential etching causing difficulties and errors in subsequent photolithographic photomasking patterning steps requiring a level or flat backside surface. For example, due the non-flatness of the process wafer backside following a wet chemical polymer stripping process, leveling difficulties are experienced in the photomasking process leading to defocusing of the photomasked pattern on the process surface. Consequently, semiconductor wafer yields are reduced and wafer manufacturing quality suffers.

There is therefore a need in the semiconductor processing art to develop a method whereby the backside of semiconductor process wafers are protected during a wet chemical polymer stripping process thereby preserving wafer backside flatness.

It is therefore an object of the invention to provide a method whereby the backside of semiconductor process wafers are protected during a wet chemical polymer stripping process thereby preserving wafer backside flatness while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for protecting a silicon semiconductor wafer backside surface during a wet etching process for removing polymer containing residues from a wafer process surface.

In a first embodiment, the method includes providing a silicon semiconductor wafer having a process surface and a backside surface said process surface including metal containing features said process surface at least partially covered with polymer containing residues and said backside surface including exposed silicon containing areas; forming an etching resistant oxide layer over the exposed silicon containing areas; and, subjecting the silicon semiconductor wafer to a series of cleaning steps including a wet etchant corrosive to the exposed silicon containing areas whereby the etching resistant oxide layer protects the backside surface from wet etching.

These and other embodiments, aspects and features of the invention are better understood from a detailed description of preferred embodiments of the invention which are described in conjunction with the accompanying Figures.

DETAILED DESCRIPTION OF THE PREFERRED EMBODIMENTS

Figure 1:
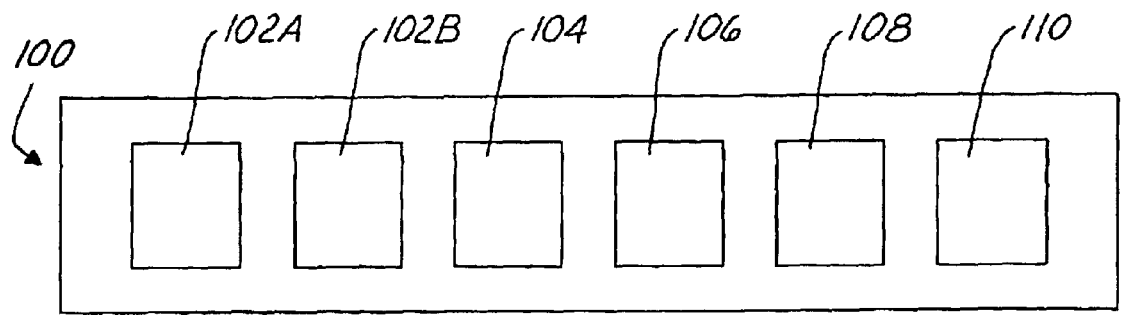
FIG. 1 is a schematic representation of a wet chemical bench process line for a wet chemical polymer stripping process carried out according to an embodiment of the present invention.

The method of the present invention is explained with reference to an exemplary wet chemical polymer stripping process according to an exemplary wet chemical bench process line following a metal etching process including, for example, a halocarbon reactive ion etching (RIE) process. It will be appreciated that while the method of the present invention is advantageously used following an RIE metal etching process, that the method of the present invention may be used in any semiconductor wafer manufacturing process where removal (stripping) of polymeric residues from the semiconductor wafer process surface is desirable while minimizing corrosive damage to exposed silicon containing areas included in the semiconductor wafer backside surface. Further, it will be appreciated that the order of the cleaning steps in the exemplary wet chemical polymer stripping process as described according to the wet chemical bench line process is not critical to the present invention. Rather, an advantageous aspect of the invention is realized in protection of the wafer backside surface from exposure to an etching solution corrosive to the backside surface including exposed silicon containing areas where the wafer backside surface is covered with an etching resistant layer prior to the wet chemical polymer stripping process.

In one embodiment of the present invention, at least a portion of the semiconductor wafer backside is covered with an etching resistant layer prior to exposure of the wafer backside surface to a wet etching solution corrosive to the at least a portion of the semiconductor wafer backside. In an exemplary embodiment, the semiconductor wafer backside, including exposed silicon portions are covered with an etching resistant layer following a plasma (RIE) ashing process and prior to a wet chemical etching process. For example, the ashing process preferably follows a plasma (RIE) etching process including a metal etching process.

In another embodiment, the etching resistant layer includes an oxide layer formed over silicon containing areas included on the surface of the wafer backside. Preferably, the oxide layer including silicon dioxide is formed over the wafer backside surface according to an in-situ plasma process including an oxygen ambient carried out following an RIE etching or RIE plasma ashing process whereby a silicon dioxide layer is grown over at least portions of the wafer backside surface including silicon containing portions. For example, in an exemplary embodiment, the oxide layer if formed at a pressure of about 1 to about 500 milliTorr, with an oxygen flow rate of about 10 sccm to about 100 sccm, and with an RF power of about 1500 to about 3500 Watts. Preferably, the oxide layer is formed over the process wafer backside surface at a thickness of about 50 Angstroms to about 500 Angstroms.

Preferably, the semiconductor wafer backside is covered with the etching resistant layer, for example, silicon dioxide, following a metal feature RIE etching process including an optional ashing process and prior to the wet chemical polymer stripping (removal) process. The metal features may include any metal including for example, tungsten, aluminum, and copper, and alloys thereof. It will be appreciated that polymer residues on the semiconductor wafer process surface may include polymeric-metal residues originating from plasma etching (RIE) of the semiconductor features including, for example, via openings or metal interconnect lines. The plasma (RIE) etching process, for example, includes halogen containing species including bromine and chlorine, for example HBr and HCl, as is known in the art for plasma (RIE) metal etching processes. Further, the semiconductor wafer may optionally be subjected to a plasma (RIE) ashing process to remove at least a portion of the photoresist and polymeric residues prior to forming the etching resistant layer covering at least a portion of the wafer backside according to the present invention.

In another embodiment of the invention, the semiconductor wafer is subjected a wet chemical polymer stripping process subsequent to the formation of the etching resistant layer covering at least a portion of the backside of the process wafer. For example, the semiconductor wafer is subjected to one or more cleaning (wet etching) steps in a primary solvent, for example, including a commercially available solvent (wet etchant) referred to as ACT, for example, including DMSO (Dimethyl-sulphur-oxide), MEA (Mono-Ethyl-Amine) and catechol. Preferably, the primary solvent includes at least one of DMSO (Dimethyl-sulphur-oxide), MEA (Mono-Ethyl-Amine) and catechol. The ACT wet etching solution, for example, is typically provided at an elevated temperature, for example between about 75° C. and about 150° C. Preferably, the cleaning steps include subsequent immersion of the semiconductor wafer in an intermediate solvent, for example, n-methyl pyrrolidone (NMP), to neutralize the semiconductor wafer following the wet etching step in the ACT (primary) solvent. It will be appreciated that other primary and intermediate solvents may used in the wet chemical polymer striping process according to the present invention as long as a solvent that etches silicon is included.

It will be appreciated that the wet chemical polymer stripping process may include cleaning steps subsequent to the cleaning step including the intermediate solvent, including for example one or more rinsing and soaking steps including immersing (dipping) the semiconductor wafer in deionized water for a period of time with or without simultaneous application of sonic energy.

It will further be appreciated that any of the cleaning steps may include one or more solution baths for immersing the semiconductor wafer and that the solution baths may be provided at elevated temperatures as is known in the art. The cleaning steps may include commonly known processes in the art including dipping or immersing the semiconductor wafer into a solution for a period of time with or without simultaneous application of agitation including sonic energy, for example, megasonic energy having a frequency of about 850 MHZ to about 900 MHZ. Preferably, the series of cleaning steps at least includes dipping the semiconductor wafer in a solution for a period of time according to a wet chemical bench cleaning process.

Referring to FIG. 1 is a schematic representation of an exemplary wet chemical bench line 100 for carrying out a wet chemical polymer removal process following covering at least a portion of the wafer backside surface with an etching resistant layer according to the present invention. In operation, by way of example, one or more process wafers are first dipped (immersed) into a primary solvent, for example, an ACT solution bath 102A for conducting wet etching. The ACT solution is normally maintained at a temperature within a range of about 75° C. to about 150° C. After a suitable time period of immersion in the ACT solution, for example, about 15 minutes, the wafer is moved to a second ACT bath 102B also maintained at a temperature within a range of about 75° C. to about 150° C. where it is again immersed for a suitable length of time, for example, about 15 minutes.

In the exemplary wet chemical polymer stripping process included in an embodiment of the present invention, the process wafer is then immersed in an intermediate solvent neutralizing bath 104 including, for example NMP, to substantially neutralize the residual acidic ACT solution remaining on the wafer surface. The NMP solution is preferably maintained in a temperature range of about 75° C. to about 150° C. The wafer is immersed in the NMP solution for a sufficient length of time to substantially neutralize the ACT, which may range from about 5 to about 15 minutes. It will be appreciated more than one NMP solution bath maintained at different temperatures may be used according to the present invention.

The process wafer is then preferably immersed (dipped) in rinse bath 106 of deionized water for rinsing with deionized water. Following the immersion in rinse in bath 106 a final rinse or soak may optionally be performed in deionized water bath 108 prior to transferring the wafer to a drying chamber 110 for wafer drying.

A robot arm or any other conventional remote operation means may be used to transport the wafers into various baths. Further, it will be appreciated that the remote operation means may be programmed so that the baths may be accessed more than once or in any order. The sequence for wafer transfer among the various solution baths is preferably programmed and may be performed in any desired sequence as will be readily determined by those skilled in the art. In addition it will be appreciated that the wet chemical bench process line may include a means for controlling the ambient environment, for example, controlling humidity and oxygen levels as well as providing filtered recirculated ambient as is known in the art.

Figure 2:
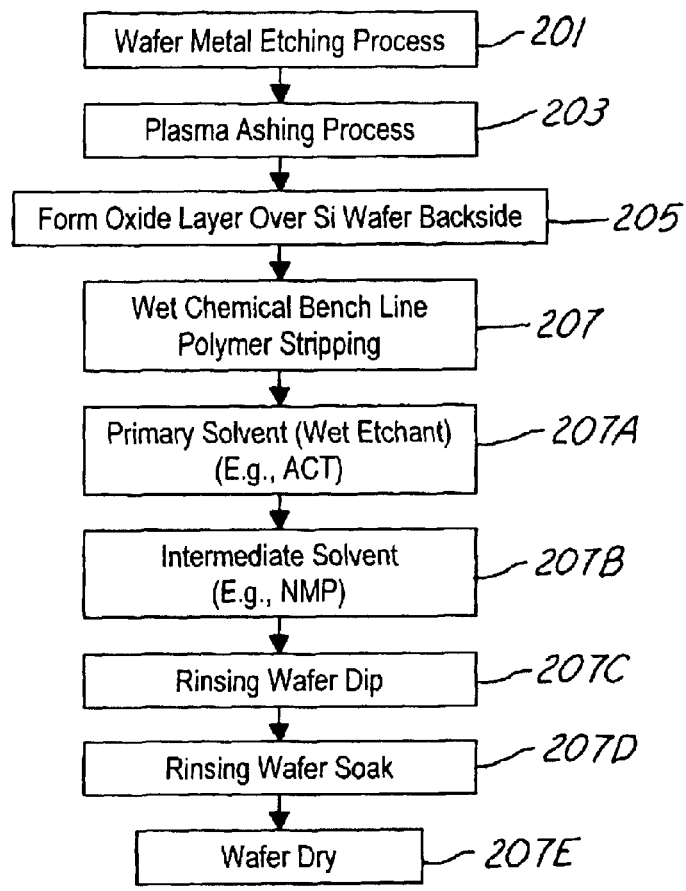
FIG. 2, is a process flow diagram including several of the embodiments of the method according to the present invention.

Referring to FIG. 2 is a process flow diagram including several embodiments of the present invention. Following a plasma (RIE) metal etching process 201 a silicon semiconductor wafer is optionally subjected to a plasma (RIE) ashing process in process 203. Following the plasma (RIE) ashing process 203, according to the present invention, at least a portion of the semiconductor wafer backside surface is covered with an etching resistant layer, for example a plasma (RIE) generated oxide to cover exposed silicon containing portions of the wafer backside surface in process 205. Following covering at least a portion of the wafer backside surface with an etching resistant layer, the semiconductor wafer is subjected to a wet chemical polymer striping process 207 to remove polymer residues from the process surface remaining on the process surface from the previous plasma (RIE) metal etching process. For example, the wet chemical polymer striping process 207 includes a wet chemical bench process line including a primary solvent that attacks exposed silicon, for example ACT. Also optionally included are process line stations including, a neutralizing solvent, and one or more rinsing stations. In one embodiment, included in the wet chemical polymer stripping process 207 are a series of cleaning steps whereby the process wafer is first treated at least once (e.g., dipped) with a primary solvent (wet etchant), e.g., ACT in cleaning step 207A followed by treatment (e.g., dipping) at least once with the intermediate solvent in process 207B. Following the intermediate solvent treatment, the process wafer is transferred to one or more rinsing stations for rinsing (e.g., dipping) with deionized water, e.g., rinsing process 207C and soaking process 207D, followed by transfer to drying station 207E for drying the process wafer.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for protecting a silicon semiconductor wafer backside surface during a wet etching process of the process surface comprising the steps of:

provideing a silicon semiconductor wafer having a process surface and a backside surface said backside surface comprising exposed silicon containing areas;

carrying out a first plasma process on the process surface;

growing an etching resistant silicon dioxide layer over the exposed silicon containing areas according to an oxygen containing plasma process; and, subjecting the process surface to a wet etchant corrosive to silicon.

2. The method of claim 1, wherein the oxygen containing plasma operating conditions comprise a pressure of about 1 to about 500 milliTorr, and an RF power of about 1500 Watts to about 3500 Watts.

3. The method of claim 1, wherein the oxygen containing plasma consists essentially of oxygen.

4. The method of claim 1, wherein the etching resistant silicon dioxide layer is grown having a thickness of from about 50 Angstroms to about 500 Angstroms.

5. The method of claim 1, wherein the first plasma process comprises a plasma ashing process.

6. The method of claim 1, wherein the wet etchant is selected from the group consisting of dimethyl-sulphuroxide, mono-Ethyl-Amine, and catechol.

7. The method of claim 1, wherein the first plasma process comprises a metal etching process.

8. The method of claim 1, wherein the step subjecting the silicon semiconductor wafer to a wet etchant steps comprises a wet chemical polymer striping process.

9. The method of claim 1, wherein the silicon dioxide layer is grown in-situ following the first plasma process.

10. A method for protecting a silicon semiconductor wafer backside surface during a wet etching process for removing polymer containing residues from a wafer process surface comprising the steps of:

providing a silicon semiconductor wafer having a process surface and a backside surface said process surface said backside surface comprising exposed silicon containing areas;

carrying out a first plasma process on the process surface selected from the group consisting of a metal etching process and an ashing process;

growing a silicon dioxide layer over the exposed silicon containing areas according to a second plasma process consisting essentially of oxygen; and, subjecting the process surface to a series of cleaning steps comprising a wet etchant corrosive to silicon.

11. The method of claim 10, wherein the second plasma process comprises a plasma operating at pressure of about 1 to about 500 milliTorr, and supplied with an RF power of about 1500 Watts to about 3500 Watts.

12. The method of claim 10, wherein oxygen is supplied to the plasma at a flow rate of about 10 sccm to about 100 sccm.

13. The method of claim 10, wherein the silicon dioxide layer is grown having a thickness of from about 50 Angstroms to about 500 Angstroms.

14. The method of claim 10, wherein the wet etchant comprises a component selected from the group consisting of dimethyl-sulphur-oxide, mono-Ethyl-Amine, and catechol.

15. The method of claim 10, wherein the series of cleaning steps comprises a wet chemical polymer stripping process.

* * * * *